(12) United States Patent
Iwazaki et al.

(10) Patent No.: US 6,831,002 B2
(45) Date of Patent: Dec. 14, 2004

(54) MANUFACTURING METHOD OF SEMICONDUCTOR DEVICE

(75) Inventors: Yoshihide Iwazaki, Tenri (JP); Shinji Suminoe, Tenri (JP); Hiroyuki Nakanishi, Nara (JP); Toshiya Ishio, Nabari (JP); Takamasa Tanaka, Nara (JP); Katsunobu Mori, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 122 days.

(21) Appl. No.: 10/242,422

(22) Filed: Sep. 13, 2002

(65) Prior Publication Data

US 2003/0134509 A1 Jul. 17, 2003

(30) Foreign Application Priority Data

Jan. 11, 2002 (JP) .......................................... 2002-005280

(51) Int. Cl.[7] .......................................... H01L 24/4763
(52) U.S. Cl. .......................................... 438/620; 438/667
(58) Field of Search .......................... 438/620, 667

(56) References Cited

U.S. PATENT DOCUMENTS 4,978,639 A * 12/1990 Hua et al. .................. 438/465
6,498,714 B1 * 12/2002 Fujisawa et al. ......... 361/306.3
2001/0052467 A1 * 12/2001 Pinckney ..................... 205/122
2003/0235982 A1 * 12/2003 Mashino ..................... 438/672

FOREIGN PATENT DOCUMENTS

| JP | 4-41697 | 2/1992 |
| JP | 2000-328291 | 11/2000 |

* cited by examiner

Primary Examiner—Lynne A. Gurley
(74) Attorney, Agent, or Firm—Birch, Stewart, Kolasch & Birch, LLP

(57) ABSTRACT

A manufacturing method of a semiconductor device for providing wires on a front surface of a semiconductor wafer by providing a plating layer, in which conductive layers provided on the front and back surfaces of the semiconductor wafer are electrically conducted by solder filled in its through-holes, and electrolytic plating is carried out by electrically connecting cathode terminals of an electrolytic plating apparatus and the conductive layer provided on the back surface of the semiconductor wafer which is provided with a mask on the conductive layer provided on its front surface.

23 Claims, 11 Drawing Sheets

MANUFACTURING METHOD OF SEMICONDUCTOR DEVICE

This nonprovisional application claims priority under 35 U.S.C. §119(a) on Patent Application No. 2002-005280 filed in Japan on Jan. 11, 2002, which is herein incorporated by reference.

FIELD OF THE INVENTION

The present invention relates to a manufacturing method of a semiconductor device in which wirings, connected electrically to elements such as other electronic components, are provided by electrolytic plating.

BACKGROUND OF THE INVENTION

In case where wirings are provided on a front surface of an insulating protective film by electrolytic plating for the purpose of electrical connection with elements such as other electronic components or wiring substrates, known is a method of providing electrical conductivity by a contact of a cathode (negative electrode) terminal of an electrolytic plating apparatus with a conductive layer as a feeding layer, which is provided on the front surface of the insulating protective film.

As such an electrolytic plating apparatus known is a jet-type electrolytic plating apparatus 100 as shown in FIG. 17.

In the electrolytic plating apparatus 100, a plating liquid blows out through a meshed anode terminal (positive electrode) 103 from a spout 102 which is provided at the center of the bottom of a cup 101. A wafer 110 is supported by a wafer support ring 104 which is provided at the top opening part of the cup 101. The wafer 110 is provided with a feeding layer, which is provided on the entire front surface where semiconductor elements are formed. Further, on the feeding layer a mask having openings corresponding to parts to be given electrolytic plating. A plurality of cathode terminals 105, provided to the wafer support ring 104, are in contact with several points of the outer periphery of the feeding layer of the wafer 110.

Plating treatment is given by passing a predetermined electric current between the anode electrode 103 and the cathode terminals 105 while applying a plating liquid blown out from the spout 102 to the front surface of the wafer 110.

However, the plating method using the electrolytic plating apparatus 100 has the following problems.

Problem 1

When a plating liquid flows into a small contact area between the cathode terminal 105 and the feeding layer, a large voltage drop causes an abnormal growth of plating deposit. The powdery abnormal plating deposit falls down and sticks on the front surface of the wafer 110, which causes a faulty plating such as plating including raised portions.

Problem 2

A larger diameter of the wafer 110 causes a difference in the plating thickness between the circumferential direction and the radial direction. This is because the cathode terminals 105 and the feeding layer come contact with each other at several contact points of the outer periphery of the wafer 110, which increases a difficulty of the flow of plating current in an area far from the contact points, thereby causing a thin plating.

One measure against the above problem 1 is a technique of Japanese Laid-Open Patent Publication No. 2000-328291 (Tokukai 2000-328291, published on Nov. 28, 2000, hereinafter referred to as "prior art 1"). The prior art 1 discloses arrangement of a wafer support ring 104 and a cathode terminal 105 and a conducting method as shown in FIG. 18. According to the prior art 1, a wafer 110 (see FIG. 17) closely sticks to a packing 106, having a smaller diameter than that of the wafer 110, which is provided so as to prevent a plating liquid from flowing into anywhere other than the surface to be plated. The cathode terminal 105 electrically contacts over the substantially entire periphery of the wafer 110 outside the packing 106, so that the cathode terminal 105 and the plating liquid cannot come into contact with each other.

Another measure against the above problem 1 is a technique of Japanese Laid-Open Patent Publication No. 41697/ 1992 (Tokukaihei 4-41697, published on Feb. 12, 1992, hereinafter referred to as "prior art 2"). The prior art 2 discloses an arrangement of a cathode terminal (a contact pin for plating) 105 and a conducting method. According to the prior art 2, a tip of a cathode terminal 105 made of metal, which electrically contacts with a feeding layer (base conductive coating film) is surrounded by a flexible insulating cover 107 having a shape of suction cup to prevent the contact with the plating liquid. The cathode terminal 105 is pushed on the wafer (a work to be plated) 110 (see FIG. 17), and the insulating cover 107 deforms and closely sticks to the wafer 110, thereby preventing the plating liquid from contacting with the tip of the cathode terminal 105.

As one measure against the above problem 2, the prior art 1 has an arrangement in which the cathode terminal 105 electrically contacts over the substantially entire periphery of the wafer 110, whereby the plating current in the feeding layer (base metallic layer) passes uniformly in the circumferential direction. Further, the anode electrode 103 (see FIG. 17) is arranged to the umbrella shape high in the center near to the wafer 11, thereby making the thickness of plating in the radial direction uniform.

Further, as another measure against the above problem 2, the thickness of the feeding layer can be increased so that the plating current can easily pass.

Incidentally, in such an arrangement as the above prior arts 1 and 2 in which the contact of the packing 106 and the insulating cover 107 with the wafer 110 separates the cathode terminal 105 and the plating liquid, involved is a risk of the substantial contact of the cathode terminal 105 and the plating liquid. Therefore, it cannot be said that the arrangement can perfectly prevent the faulty plating caused by the growth of the abnormal plating deposit due to the contact of the plating liquid and the cathode terminal. Accordingly, inevitable are damage to the wafer 110 when the contact occurs and increased costs along with maintenance of the electrolytic plating apparatus 100 including the cathode terminal 105.

Further, the above prior art 1 has an arrangement in which the cathode terminal 105 electrically contacts over the substantially entire periphery of the feeding layer outside the packing 106, which is provided to prevent the plating liquid from flowing into anywhere other than the surface to be plated. However, the packing 106 contacts over the substantially entire periphery of the wafer 110; therefore, an outer part from the packing 106 is not plated. This results in decrease in yield and requires a condition that parts where the packing 106 contacts should be flat.

Further, in the arrangement of the prior art 2 in which the insulating cover 107 is provided around the tip of the cathode terminal 105 to prevent the contact with the plating liquid, it is important to keep the optimal balance in height between the tip of the cathode terminal 105 and the top end part of the insulating cover 107. Because of a small difference in height between the tip of the cathode terminal 105 and the top end part of the insulating cover 107, the cathode terminal 105 comes into contact with the wafer 110 before the deformed insulating cover 107 sticks to the wafer 110. This causes less stickiness of the insulating cover 107, so that the cathode terminal 105 and the plating liquid comes into contact with each other. Conversely, when the position of the tip of the cathode terminal 105 is too much lower than the insulating cover 107, the electrical contact of the wafer 110 and the cathode terminal 105 is difficult, which causes a poor conductivity.

Further, in the conducting method of the above prior art 1, the anode electrode 103 has the umbrella shape high in the center near to the wafer 110 to make the thickness of plating in the radial direction uniform, with consideration that the plating current in the radial direction of the wafer 110 is decreased toward the center of the wafer 110. However, it is necessary to work the meshed anode electrode 103 into an umbrella shape, thereby increasing manufacturing costs. Further, it is necessary to change a suitable shape of the anode electrode 103 and its position, depending on conditions such as a wiring arrangement of the semiconductor device, so that it is impossible to provide a plating treatment to different types of wafers with the same electrolytic plating apparatus.

In order to make the plating current easy to flow, expensive materials such as Au for the feeding layer is used in the arrangement to increase the thickness of the feeding layer, thereby increasing manufacturing costs. Further, the feeding layer on which the plating layer is not provided must be removed by methods such as etching. However, the thicker the feeding layer is, longer the time required for a treatment process is. Further, in case of chemical etching, etching is carried out in the longitudinal direction as well as the thickness direction. This causes excessive removal of the feeding layer under the plating layer as a wiring, which might occur a poor wiring.

SUMMARY OF THE INVENTION

An object of the present invention is to provide a manufacturing method of a semiconductor device which can prevent a faulty plating caused by the growth of abnormal plating deposit due to the contact of a plating liquid and a cathode terminal.

A further object of the present invention is to provide a manufacturing method of a semiconductor device in which a plating layer having a uniform thickness can be provided.

To achieve the above objects, a manufacturing method of a semiconductor device according to the present invention for providing wires on a front surface of a semiconductor wafer in such a manner that a conductive layer is provided over a substantially entire front surface of a semiconductor wafer for mounting semiconductor elements, electrolytic plating is carried out to a wiring part on the conductive layer, and then the conductive layer not including the wiring part is partially removed, the manufacturing method includes the steps of:
(a) providing a plurality of through-holes each of which passes between the front and back surfaces of the semiconductor wafer and then providing conductive material in the through-holes;
(b) providing the conductive layer over the substantially entire front surface of the semiconductor wafer;
(c) providing the conductive layer over a substantially entire back surface of the semiconductor wafer; and
(d) electrically connecting between the conductive layer on the back surface of the semiconductor wafer and cathode terminals of an electrolytic plating apparatus and carrying out electrolytic plating with respect to the wiring part.

Note that, the order of the above steps is not limited to that described above.

Generally, in a manufacturing method of a semiconductor device, in case where wires are provided by electrolytic plating for the purpose of electrical connection with elements such as other electronic components or wiring substrates, known is a method of providing electrical conductivity by a contact of a cathode (negative electrode) terminal of an electrolytic plating apparatus with a conductive layer as a feeding layer, which is provided on the front surface of the insulating protective film.

The feature of the manufacturing method of a semiconductor device according to the present invention is that as a semiconductor wafer according to the manufacturing method of the above semiconductor device, used is a semiconductor wafer being provided with conductive layers over the substantially entire front and back surfaces thereof, wherein, for example, a mask is formed on the conductive layer provided on the front surface, and conductive material provided in through-holes enables the conductive layers provided on the front and back surfaces to conduct electricity.

The conductive layers provided over the substantially entire front and back surfaces of the semiconductor wafer may be provided over the entire front and back surfaces of the semiconductor wafer, provided that the conductive layers are provided over a sufficient area so as to serve as a feeding layer for plating. That is, the area where the conductive layer of the front surface of the semiconductor wafer is provided may be an area which includes contact points with cathode terminals of the electrolytic plating apparatus and the provision region of the through-holes, provided that the provision region is included in an area which includes any one of the contact points. Further, the area where the conductive layer of the back surface of the semiconductor wafer is provided may be an area which includes the provision region of a plating layer (electrolytic plating layer) and the provision region of the through-holes, provided that the provision region of the plating layer is included in an area which includes any one of through-holes.

According to the above arrangement, the conductive layer of the back surface of the semiconductor wafer can include the contact points with the cathode terminals of the electrolytic plating apparatus in its area, and it is possible to obtain conductivity inside the conductive layer as the feeding layer, because of the plating current which flows from the cathode terminal contacting with the conductive layer. Further, the conductive material provided in the through-hole of the semiconductor wafer can provide conductivity between the electronically conductive layers of the back and front surfaces of the semiconductor wafer. Still further, the conductive layer of the front surface of the semiconductor wafer can include the provision region of the through-holes in its area, and it is possible to obtain conductivity inside the conductive layer as a base of the plating layer, so that the conductive layer of the front surface can be a feeding layer (a feeding layer for plating) to provide a plating layer. Therefore, it is possible to provide the plating layer on the conductive layer side of the front surface of the semiconductor wafer.

Here, the cathode terminal of the electrolytic plating apparatus is in contact with the conductive layer of the back surface of the semiconductor wafer, in other words, not in contact with the front surface to be provided the plating layer, so that, for example, it is possible to prevent the contact of the plating liquid, which is applied to the front surface of the semiconductor wafer of the jet-type electrolytic plating apparatus, and the cathode terminal. Therefore, it is possible to prevent the occurrence of the faulty plating caused by the growth of the abnormal plating deposit. Accordingly, it is possible to reduce the costs for damage to the semiconductor wafer when the contact occurs and for maintenance of the electrolytic plating apparatus including the cathode terminal.

Further, it is possible to prevent the contact of the plating liquid and the cathode terminal, so that it is not necessary to provide a packing and others on the supporting side by the contact with the surface of the semiconductor wafer so as to prevent the plating liquid from flowing into anywhere other than a target area of plating. Accordingly, a minimized part of supporting the semiconductor wafer can maximize a target area of plating on the surface of the semiconductor wafer. Still further, it is possible to hang the semiconductor wafer so as to support it, so that the entire front surface of the semiconductor wafer can be a target area of plating. Therefore, it is possible to increase yield in manufacturing the semiconductor wafer. Further, it is possible to stop restriction such that a contact part with the packing and others should be flat, which can simplify the management of the manufacturing process of the semiconductor wafer.

As a result of this, it is possible to provide the manufacturing method of the semiconductor device which can prevent the faulty plating caused by the growth of abnormal plating deposit due to the contact of the plating liquid and the cathode terminal.

For a fuller understanding of the nature and advantages of the invention, reference should be made to the ensuing detailed description taken in conjunction with the accompanying drawings.

DESCRIPTION OF THE EMBODIMENTS

First Embodiment

Referring to FIG. 1 through FIG. 11, the following will describe one embodiment of the present invention.

Over an entire surface of a semiconductor wafer 1 (hereinafter referred to simply as "wafer") as a semiconductor substrate according to the present embodiment provided is an insulating protective film not shown.

The following will describe a process of fabricating a conducting semiconductor wafer for providing a wafer which obtains electrical conductivity on its front and back surfaces and which is provided with a mask with respect to the wafer 1, as shown in FIGS. 1 through 7.

First, as shown in FIGS. 1 through 4, the following will describe a step of electrically conducting through-holes for providing the wafer 1 which is provided with a solder 4 as conductive material in through-holes 2.

Figure 1:
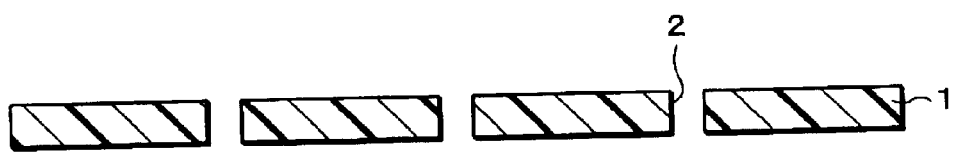
FIG. 1 shows one embodiment of a manufacturing method of a semiconductor device according to the present invention and is a sectional view of a wafer which is provided with through-holes.

As shown in FIG. 1, as a step of providing through-holes, the wafer 1 is perforated with through-holes 2 by chemical etching using liquid solution or by dry etching using reactive gas.

Note that, it is preferable that the through-holes 2 are provided in the vicinity of a contact position of a cathode terminal 34 (see FIG. 11) of an electrolytic plating apparatus 30 (see FIG. 11) and a conductive layer 6 provided on the back surface of the wafer 1 (the surface of bottom side in FIG. 8), in a step of plating, which will be described later, shown in FIG. 8. However, the position and the number of the through-hole 2 to be provided may be determined so that sufficient conductivity can be obtained inside a conductive layer 5 provided on the front surface of the wafer 1 (the surface of upper side in FIG. 8) and the conductive layer 6 provided on the back surface, and a plating layer 8 having a uniform thickness can be provided. Further, the diameter of the through-hole 2 to be provided may be determined so that sufficient conductivity can be obtained by the solder 4 (conductive material) which is filled in the through-holes 2 in a step of filling conductive material (solder) (see FIGS. 3 and 4), which will be described later.

Figure 2:
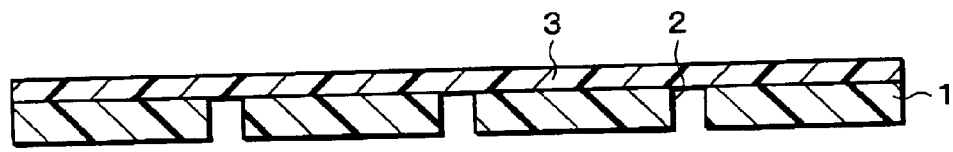
FIG. 2 is a sectional view of a wafer in the state in which a protective sheet is pasted on the wafer.

Next, as a step of providing a protective layer, a protective sheet 3 as a protective layer is pasted on an element providing surface, which is a front surface of the wafer 1, as shown in FIG. 2. As an example of material adopted for the protective layer 3 given are PVC (polyvinyl chloride), PE (polyethylene), PET (polyethylene terephthalate). However, the material is not limited to these, and materials such as PI (polyimide), PA (polyamide) may be also adopted.

Here, the protective sheet 3 is pasted on the entire front surface of the wafer 1 so as to cover the through-holes 2. However, the present invention is not limited to this. The protective sheet 3 is provided so as to prevent the solder 4 filled in the through-holes 2 from flowing into the front surface of the wafer 1 in the subsequent step of filling conductive material (see FIGS. 3 and 4). Therefore, the pasted protective sheet 3 may have a shape including such an area that can cover openings of the through-holes 2 on the front surface of the wafer 1 and can prevent the solder 4 from flowing into the front surface of the wafer 1. Note that, the protective layer may be provided by application, instead of pasting the protective sheet 3.

Figure 3:
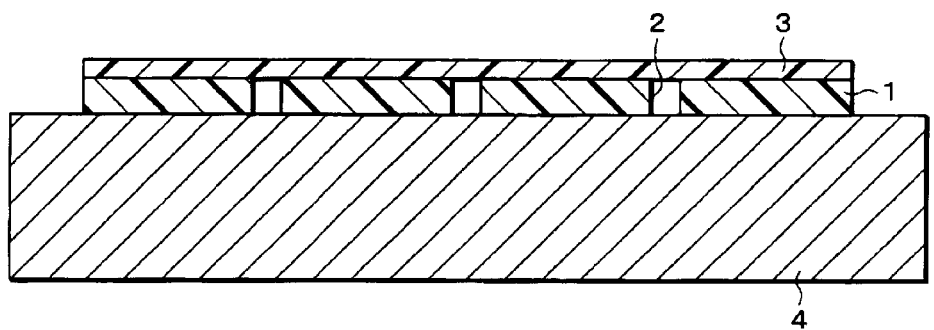
FIG. 3 is a sectional view of a wafer in the state in which the wafer is provided on a molten solder to fill it in the through-holes of the wafer.
Figure 4:
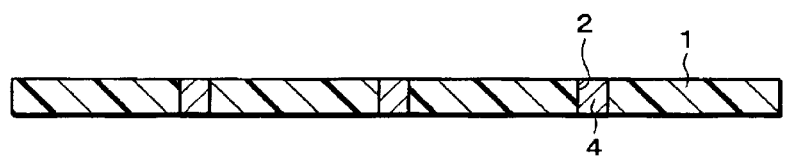
FIG. 4 is a sectional view of a wafer in the state in which a protective sheet is peeled off from the wafer.

Next, as the step of filling conductive material, the following will describe a step for filling the solder 4 as conductive material in the through-holes 2 (FIGS. 3 and 4).

As shown in FIG. 3, as a step of arranging conductive material, the wafer 1 is arranged on the molten solder 4 so that the solder 4 and the back surface of the wafer 1 come into contact with each other. Next, a pressure in an area including the wafer 1 and the molten solder 4 is reduced as a step of reducing a pressure. Thereafter, as a step of returning a pressure, the pressure in the area is returned to an ambient pressure so that the molten solder 4 is filled in the through-hole 2 (see FIG. 4).

Note that, the order of the above steps is not limited to this. Instead, for example, after the pressure in the area including the wafer 1 and the molten solder 4 is reduced as the step of reducing a pressure, the wafer 1 is arranged on the molten solder 4 so that the solder 4 and the back surface of the wafer 1 come into contact with each other as the step of arranging conductive material. Thereafter, the pressure in the area may be returned to the ambient pressure as the step of returning a pressure so that the molten solder 4 is filled in the through-holes 2. Further, the molten solder 4 is filled in the through-holes 2; however, the material is not limited to this. Conductive paste and other metals may be filled.

Note that, a method for providing conductive material in the through-holes 2 is not limited to filling material such as the solder 4 in the through-holes 2. Instead, for example, an electric conductor such as plating may be provided in the through-holes 2, or conductive paste may be injected into the through-holes 2.

Next, after the molten solder 4 is filled in the through-holes 2, the protective sheet 3 is peeled off from the wafer 1 as a step of peeling off a protective layer, as shown in FIG. 4.

This is the end of the step of electrically conducting through-holes for providing the wafer 1 which is provided with the solder 4, passing the step of filling conductive material for filling the solder 4 in the through-holes 2.

Figure 5:
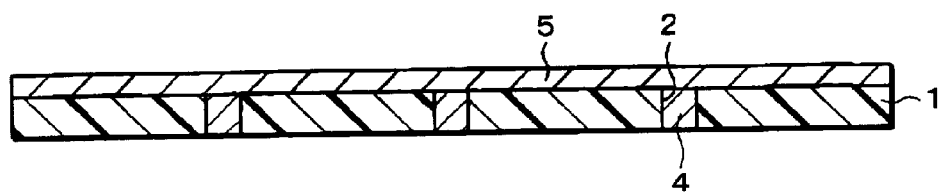
FIG. 5 is a sectional view of a wafer in the state in which a conductive layer is provided on a front surface of the wafer.

Next, as shown in FIG. 5, as a step of providing a conductive layer on a front surface, the conductive layer 5 having a thickness of 300 nm is provided by sputtering on the substantially entire front surface of the wafer 1. Here, a method for providing the conductive layer 5 is not limited to sputtering. For example, appropriate methods such as vacuum deposition may be adopted. Further, the thickness of the conductive layer 5 is not limited to 300 nm, provided that sufficient conductivity can be secured inside the conductive layer 5 in the step of plating (see FIG. 8), which will be described later.

Note that, the area where the conductive layer 5 is provided is not limited to the substantially entire front surface of the wafer 1. For example, it may be an entire front surface of the wafer 1, or may be an area which includes contact points with cathode terminals 34 (see FIG. 11) of the electrolytic plating apparatus 30 (see FIG. 11) as described later and the provision region of the through-holes 2, provided that the provision region is included in an area which includes any one of the contact points.

Figure 6:
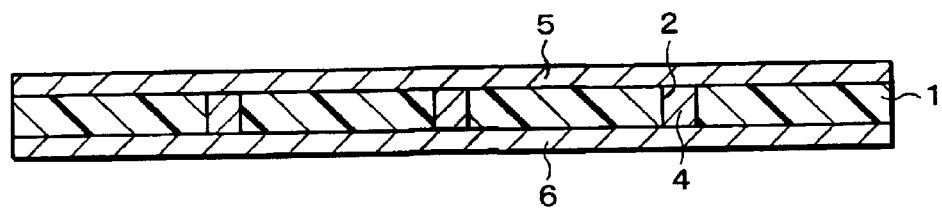
FIG. 6 is a sectional view of a wafer in the state in which a conductive layer is provided on a back surface of the wafer.

Next, as shown in FIG. 6, as a step of providing a conductive layer on a back surface, the conductive layer 6 having a thickness of 300 nm is provided by sputtering on the substantially entire back surface of the wafer 1. Here, a method for providing the conductive layer 6 is not limited to sputtering. For example, appropriate methods such as vacuum deposition may be adopted. Further, the thickness of the conductive layer 6 is not limited to 300 nm, provided that sufficient conductivity can be secured inside the conductive layer 6 in the step of plating, which will be described later.

Note that, the area where the conductive layer 6 is provided is not limited to the substantially entire back surface of the wafer 1. For example, it may be an entire back surface of the wafer 1, or may be an area which includes the provision region of a plating layer 8 (see FIG. 8) and the provision region of the through-holes 2, provided that the provision region of the plating layer 8 is included in an area which includes any one of through-holes 2. Note that, the conductive layer 6 provided on the back surface of the wafer 1 may be provided prior to the provision of the conductive layer 5 on the front surface of the wafer 1. Further, as an example of material of the conductive layers 5 and 6 given are metals such as gold and copper.

Figure 7:
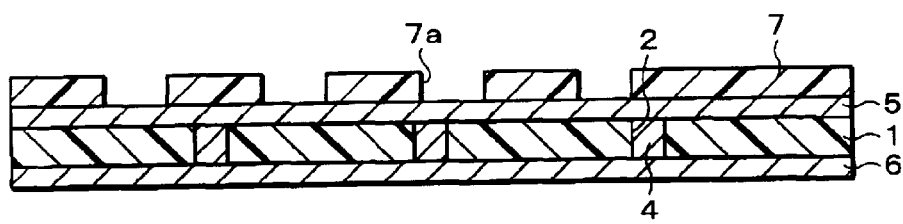
FIG. 7 is a sectional view of a wafer in the state in which a mask is provided on the front surface of the wafer.

Next, as shown in FIG. 7, as a step of providing a mask, a mask 7 of 10 μm in thickness, having mask openings 7a corresponding to parts to be plated, is provided by photosensitive resin (photo resist) as an electrical insulating material on the conductive layer 5 of the front surface of the wafer 1. Here, the thickness of the photosensitive resin is not limited to 10 μm, provided that its sufficient thickness for provision of wiring (see FIG. 8), which will be described later, can be secured.

This is the end of the process of fabricating a conducting semiconductor wafer for providing the wafer 1 which obtains electrical conductivity on its front and back surfaces and which is provided with the mask 7.

Figure 8:
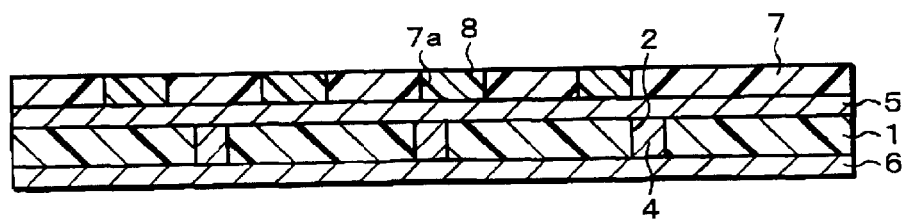
FIG. 8 is a sectional view of a wafer in the state in which electrolytic plating treatment is given to the wafer.

Next, as a step of electrolytic plating, the electrolytic plating apparatus 30 (see FIG. 11) gives electrolytic plating with respect to the conductive layers 5 and 6 as feeding layers, which are formed on the front and back surfaces of the wafer 1, so as to provide a plating layer 8 (electrolytic plating layer) on the front surface of the wafer 1, as shown in FIG. 8. The plating method using the electrolytic plating apparatus 30 will be described later.

Figure 9:
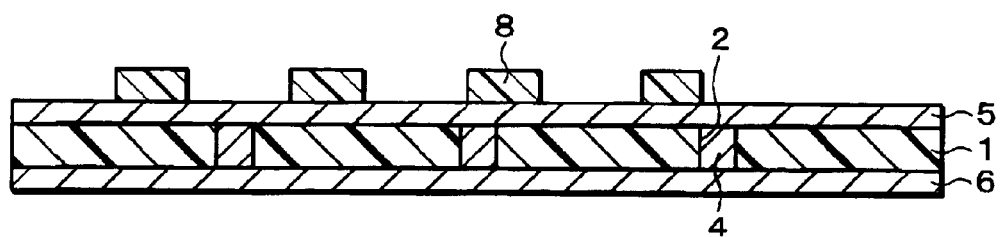
FIG. 9 is a sectional view of a wafer in the state in which a mask is peeled off from the wafer.

After the provision of the plating layer 8 by the electrolytic plating, as a step of peeling off a mask, the mask 7 is peeled off from the wafer 1 as shown in FIG. 9.

Figure 10:
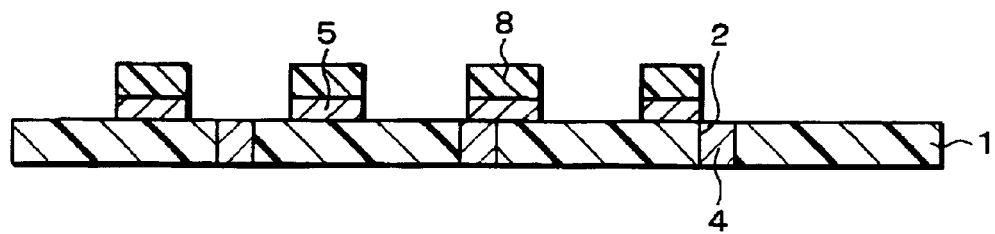
FIG. 10 is a sectional view of a wafer in the state in which electrically independent wirings are provided on the wafer.

Next, as shown in FIG. 10, as a step of etching (a step of removing a conductive layer), the conductive layers 5 and 6 provided, respectively, on the front and back surfaces of the wafer 1 are removed by means of acid etching to provide a plurality of wires which are electrically independent. Here, a method for etching may be dry etching with plasma, instead of acid etching. As a step of dicing, a final step, the wafer 1 is diced into small pieces of chips for the completion of the semiconductor device. Note that, in case of dry etching, the conductive layer 6 on the back surface of the wafer 1 does not require etching treatment, and a plurality of electrically independent wirings may be formed by dicing the conductive layer 6 provided on the back surface of the wafer 1 in the step of dicing into small pieces of chips.

Figure 11:
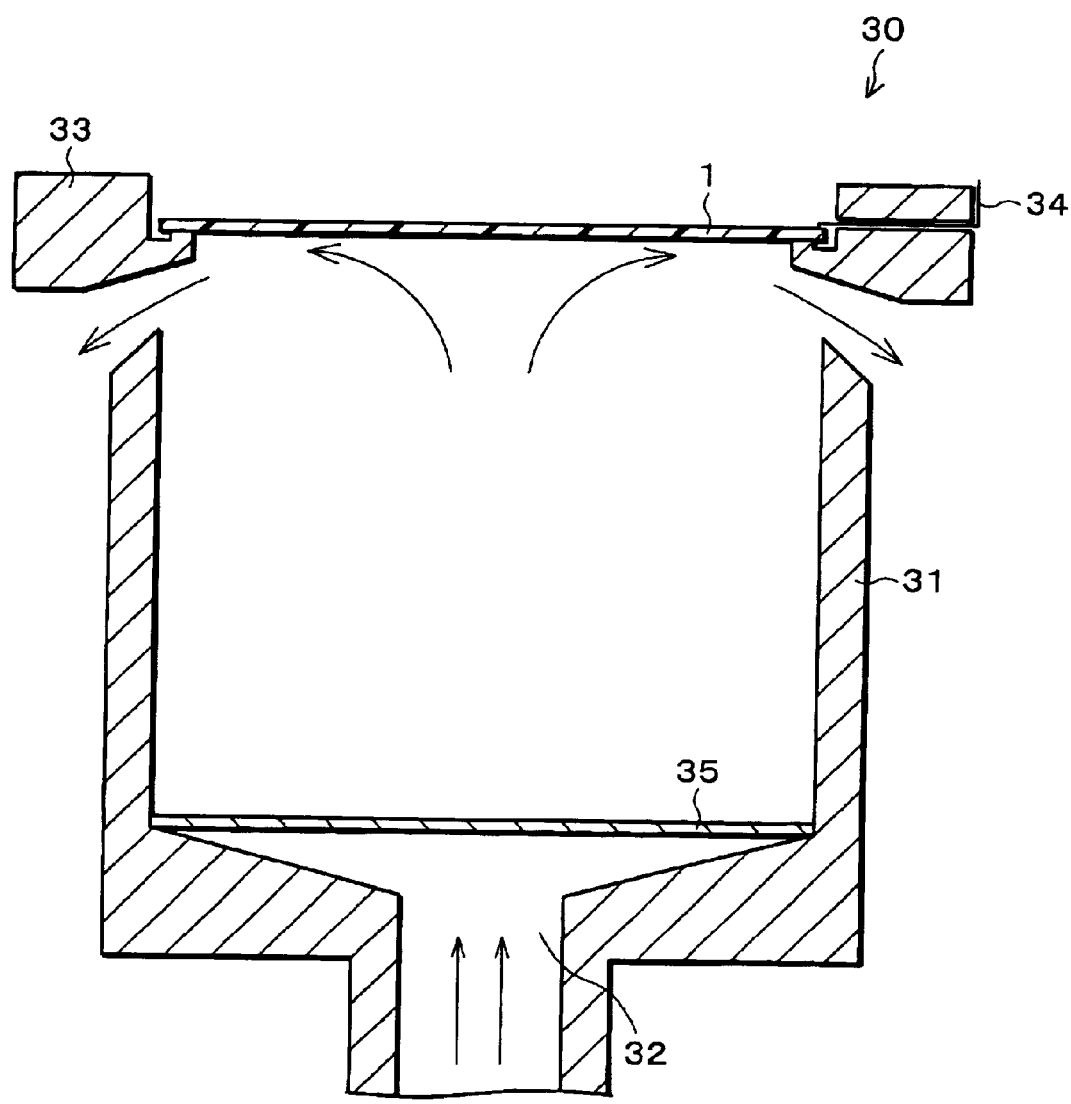
FIG. 11 is a sectional view of an electrolytic plating apparatus used for a manufacturing method of the semiconductor device.

Here, the following will describe the plating method using the electrolytic plating apparatus 30 with reference to FIG. 11.

In the electrolytic plating apparatus 30, a plating liquid blows out through a meshed anode electrode 35 from a spout 32 which is provided at the center of the bottom of a cup 31. The wafer 1 is supported by a wafer support ring 33 which is provided at the top opening part of the cup 31. A plurality of cathode terminals 34, provided to the wafer support ring 33, are in contact with the conductive layer 6 of the back surface of the wafer 1.

Plating treatment is given by passing a predetermined electric current between the anode electrode 35 and the cathode terminals 34 while applying a plating liquid blown out from the spout 32 to the surface of the wafer 1.

Note that, it is preferable that the contact positions of the cathode terminals 34 with the conductive layer 6 are in the vicinity of the through-holes 2. However, they may be any positions, provided that uniform plating current flows inside the conductive layer 5. For example, the contact positions may be a plurality of contact points included in the vicinity of an outer periphery of the wafer 1 and the vicinity of a center part of the wafer 1 or may be a plurality of contact points included in the vicinity of an intermediate part between the outer periphery and center part. Further, the cathode terminals 34 and the conductive layer 6 may be contacted with each other surface to surface. For example, the substantially entire surface of the cathode terminal 34 substantially equal in shape and size to the wafer 1, which is provided on the conductive layer 6 side, may come into contact with the conductive layer 6. In such a case, the cathode terminal 34 and the conductive layer 6 can always come into contact with each other in the vicinity of the through-holes 2 regardless of the position of the through-holes 2, different types of semiconductor devices can be treated with the same electrolytic plating apparatus.

Further, the cathode terminals 34 may electrically come into contact with the conductive layer 6 at any one of positions and a plurality of positions with any shape and arrangement, provided that the contact with the conductive layer 6 is secure from upper part of FIG. 11. Therefore, it is possible to provide a plating treatment by using the same electrolytic plating apparatus 30 regardless of an arrangement of the semiconductor device.

Here, the cathode terminals 34 are in contact with the conductive layer 6 provided on the back surface of the wafer 1, more specifically, the cathode terminals 34 are in contact with the conductive layer 6 by pushing the wafer 1 from above in FIG. 11, so that the plating liquid and the cathode terminals 34 never come contact with each other. Further, even if the plating liquid flows into a wafer support section of the wafer support ring 33, the plating liquid never flow into the back surface of the wafer 1 which is located at the top side. Therefore, it is possible to prevent the occurrence of faulty plating caused by the growth of the abnormal plating deposit.

Further, the conductive layer 6 provided on the back surface of the wafer 1 has the contact positions with the cathode terminals 34 in its area and has such a thickness that sufficient conductivity is secured over the entire surface of the wafer 1, so that it is possible to obtain sufficient conductivity inside the conductive layer 6 as a feeding layer over its entire surface by the plating current which flows from the tip of the cathode terminals 34 to be contacted with the conductive layer 6. Still further, the solder 4 filled in the through-holes 2 of the wafer 1 can provide sufficient conductivity between the conductive layer 6 provided on the back surface of the wafer 1 and the conductive layer 5 provided on the front surface of the wafer 1. Also, the conductive layer 5 provided on the front surface of the wafer 1 includes the region of the formed through-hole 2 in its area and has such a thickness that sufficient conductivity is secured over its entire surface as a base of the plating layer 8. This allows uniform plating current to pass over the entire surface of the conductive layer 5 as a feeding layer, so that it is possible to provide the plating layer 8 having a substantially uniform thickness.

Figure 18:
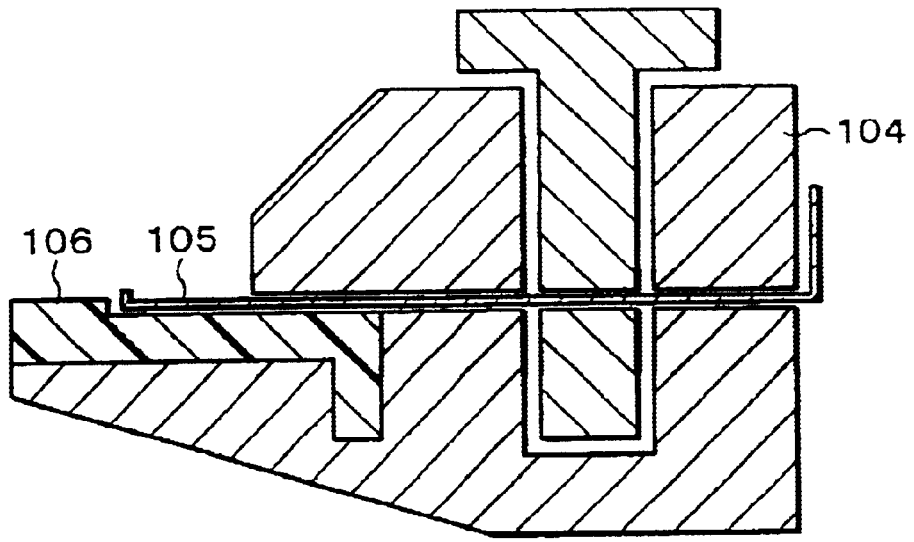
FIG. 18 is a sectional view of a wafer support ring of the electrolytic plating apparatus.
Figure 19:
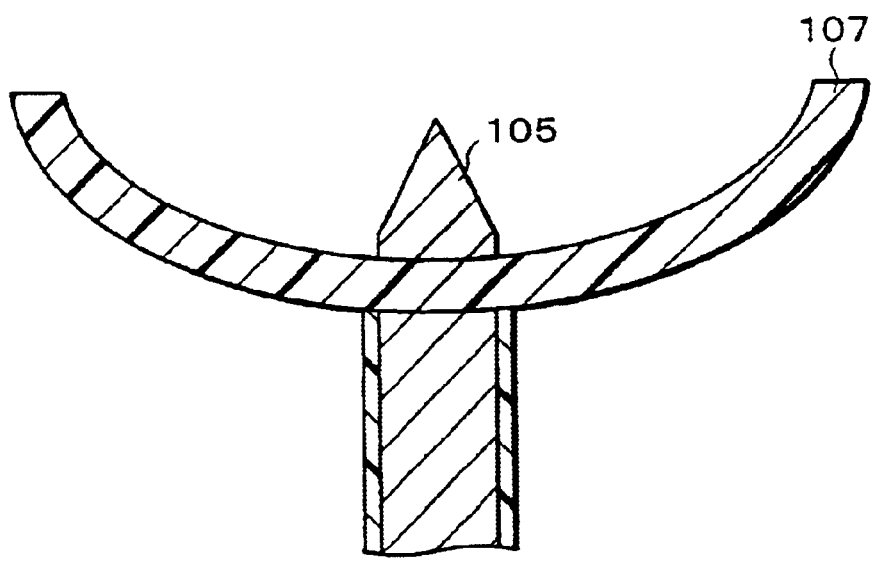
FIG. 19 is a sectional view of a tip of a cathode terminal of another conventional electrolytic plating apparatus.

Further, the plating liquid and the cathode terminals 34 does not come into contact with each other, so that it is not necessary to provide, for example, a packing 106 (see FIG. 18) and others on the supporting side by the contact with the surface of the wafer 1 so as to prevent the plating liquid from flowing into anywhere other than a target area of plating. Therefore, a minimized part of supporting the wafer 1 can maximize a target area of plating on the surface of the wafer 1. Still further, it is possible to hung the wafer 1 so as to support it, so that all of the front surface of the wafer 1 can be a target area of plating. Therefore, it is possible to increase yield in manufacturing the wafer 1. Further, it is possible to stop restriction such that a contact part with the packing 106 and others should be flat, which can simplify the management of the manufacturing process of the wafer 1.

Second Embodiment

The following will describe another embodiment of the present invention with reference to FIGS. 12 through 16. Note that, for the purpose of explanation, members having the same functions as those described in the First Embodiment are given the same reference numerals and explanations thereof are omitted here.

Over the entire surface of a wafer 1 according to the present invention provided is an insulating protective film not shown.

The following will describe a process of fabricating a conducting semiconductor wafer for providing a wafer which obtains electrical conductivity on its front and back surfaces and which is provided with a mask with respect to the wafer 1, as shown in FIGS. 12 through 16.

Figure 12:
FIG. 12 shows another embodiment of a manufacturing method of a semiconductor device according to the present invention and is a sectional view of a wafer which is provided with a conductive layer on its front surface.

As shown in FIG. 12, as a step of providing a conductive layer on a front surface, a conductive layer 5 having a thickness of 300 nm is provided by sputtering on the substantially entire front surface of the wafer 1.

Figure 13:
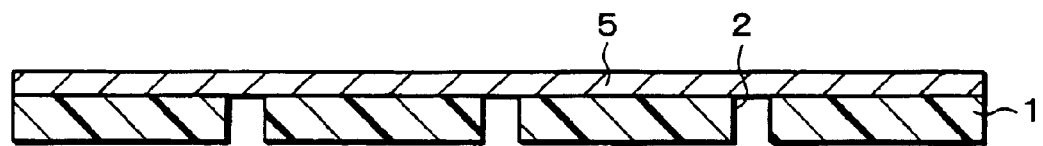
FIG. 13 is a sectional view of a wafer in the state in which the wafer is provided with through-holes on its front surface.

Next, as shown in FIG. 13, as a step of providing through-holes, the wafer 1 is perforated with through-holes 2 by chemical etching using liquid solution or by dry etching using reactive gas.

Figure 14:
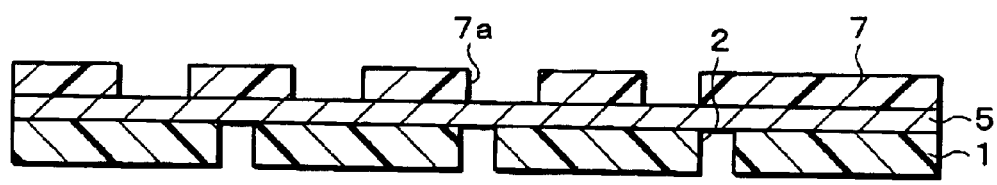
FIG. 14 is a sectional view of a wafer in the state in which a mask is provided on the front surface of the wafer.

Next, as shown in FIG. 14, as a step of providing a mask, a mask 7 of 10 $\mu$m in thickness, having mask openings 7a corresponding to parts to be plated, is provided by photosensitive resin as an electrical insulating material, having such a shape that covers at least through-holes 2 at least at the position that covers through-holes 2, on the conductive layer 5 of the front surface of the wafer 1. Further, a step of exposure development to the photosensitive resin is not carried out necessarily at this stage, and the step may be carried out after a molten solder 4 is filled in the through-holes 2.

Figure 15:
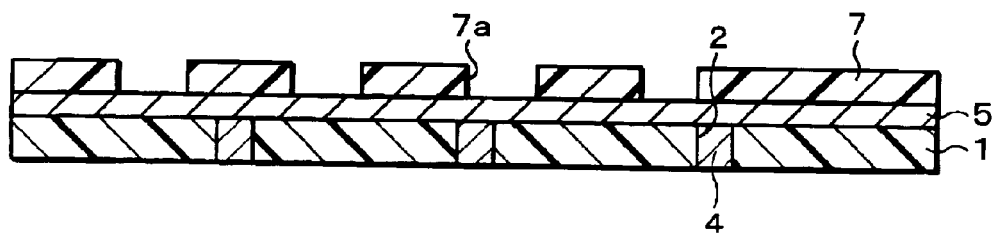
FIG. 15 is a sectional view of a wafer in the state in which a molten solder is filled in the through-holes of the wafer.

Next, as a step of filling conductive material, as shown in FIG. 15, the solder 4 as conductive material is filled in the through-holes 2.

Thus, a step of conducting through-holes according to the present invention includes the step of providing through-holes, the step of providing a mask, and the step of filling conductive material, for example, in this order. Note that, the order of each steps in the step of conducting through-holes is not limited to that described above.

Figure 16:
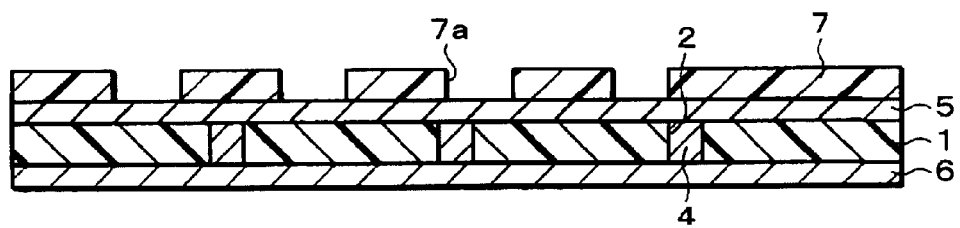
FIG. 16 is a sectional view of a wafer in the state in which a conductive layer is provided on a back surface of the wafer.
Figure 17:
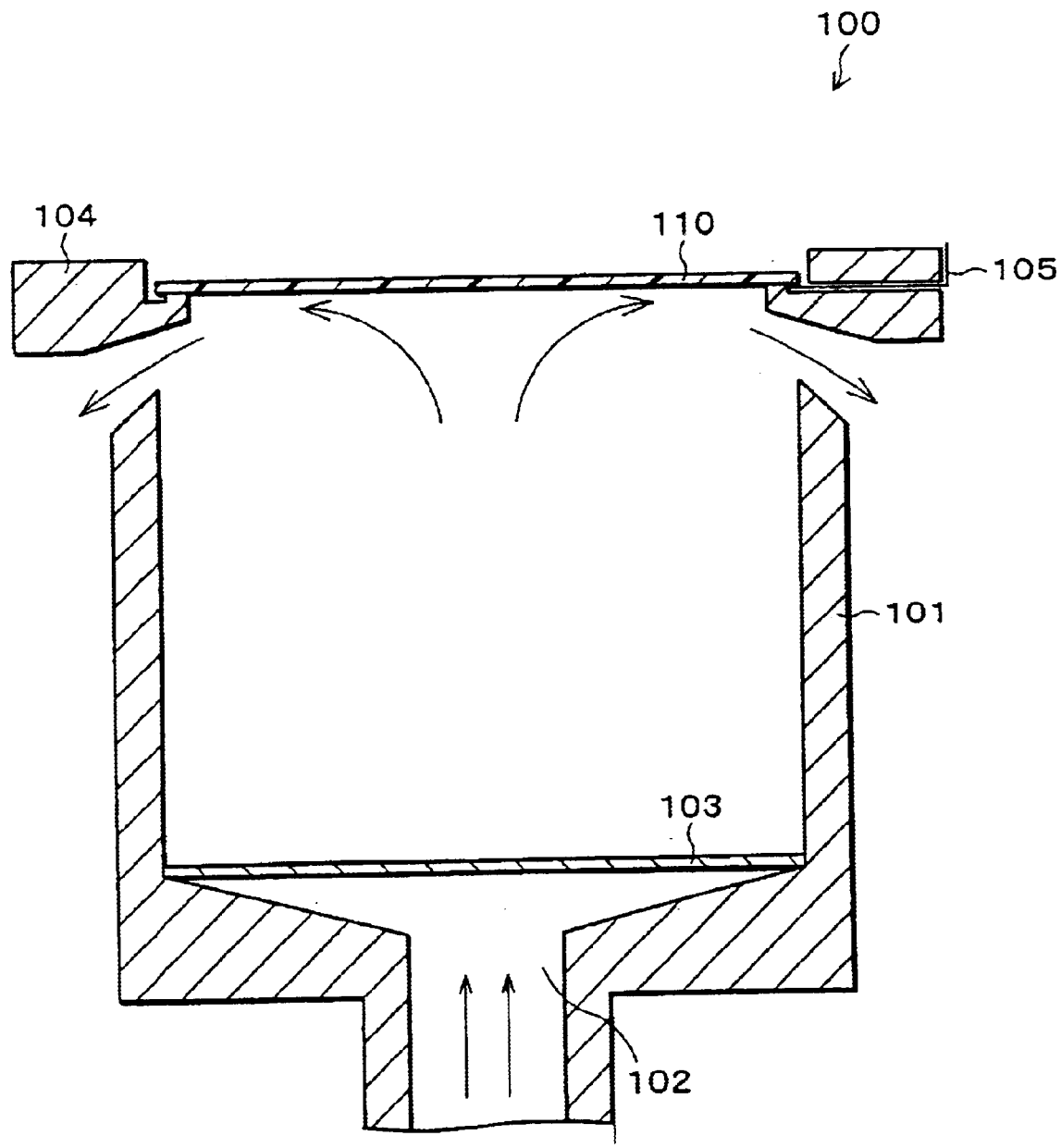
FIG. 17 is a sectional view of the conventional electrolytic plating apparatus.

Next, as shown in FIG. 16, as a step of providing a conductive layer 6 on a back surface, a conductive layer 6 having a thickness of 300 nm is provided by sputtering on the substantially entire back surface of the wafer 1.

This is the end of the process of fabricating a continuing semiconductor wafer for providing the wafer 1 which obtains electrical conductivity on its front and back surfaces and which is provided with the mask 7.

Note that, as to the plating method using the electrolytic plating apparatus 30 and subsequent steps for the manufacture of the semiconductor device, detailed explanations are omitted here because they are the same as those employed by the First Embodiment.

As described above, a manufacturing method of a semiconductor device according to the present invention is a method including the steps of:

(a) providing a plurality of through-holes each of which passes between the front and back surfaces of the semiconductor wafer and then providing conductive material in the through-holes;

(b) providing the conductive layer over the substantially entire front surface of the semiconductor wafer;

(c) providing the conductive layer over a substantially entire back surface of the semiconductor wafer; and (d) electrically connecting between the conductive layer on the back surface of the semiconductor wafer and cathode terminals of an electrolytic plating apparatus and carrying out electrolytic plating with respect to the wiring part.

Therefore, it is possible to prevent the occurrence of the faulty plating caused by the growth of the abnormal plating deposit. Accordingly, it is possible to reduce the costs for damage to the semiconductor wafer when the contact occurs and for maintenance of the electrolytic plating apparatus including the cathode terminals. Therefore, it is possible to increase yield in manufacturing the semiconductor wafer. Further, it is possible to simplify the management of the manufacturing process of the semiconductor wafer.

As a result of this, it is possible to provide the manufacturing method of a semiconductor device which can prevent the faulty plating caused by the growth of abnormal plating deposit due to the contact of the plating liquid and the cathode terminals.

A manufacturing method of a semiconductor device according to the present invention may be a method in which substantially uniform plating current is flown inside the conductive layer of the front surface of the semiconductor wafer in the step (d).

The above arrangement allows substantially uniform plating current to flow inside the conductive layer as a plating feeding layer provided on the front surface of the semiconductor wafer, so that it is possible to provide a plating layer of a substantially uniform thickness.

Further, for example, in case where the jet-type electrolytic plating apparatus is used, it is not necessary to work meshed anode electrode (positive electrode) into shapes such as an umbrella shape, and it is possible to provide treatments with the same electrolytic plating apparatus even if the semiconductor wafer differs in wiring arrangement and others, so that it is possible to simplify the management of the manufacturing process of the semiconductor wafer.

A manufacturing method of a semiconductor device according to the present invention may be a method in which the conductive layer provided on the back surface of the semiconductor wafer and the cathode terminals of the electrolytic plating apparatus are electrically connected so that the conductive layers on the front and back surfaces of the semiconductor wafer are substantially electrically connected.

Further, according to the above arrangement, the conductive layer provided on the back surface of the semiconductor wafer and the cathode terminals of the electrolytic plating apparatus are electrically connected so that the conductive layers on the front and back surfaces of the semiconductor wafer are substantially electrically connected. Therefore, it is possible to obtain the conductivity of the cathode terminals and the conductive layer of the front surface through the conductive layer provided just above the conductive material in the through-holes wherever the through-holes having conductive material are provided in the semiconductor wafer. Even if the positions of the through-holes are different, it is possible to process with the same electrolytic plating apparatus, so that it is possible to simplify the management of the process. Also, it is possible to obtain a substantially uniform plating current without decrease with respect to the conductive layer on the front surface around the through-holes, so that it is possible to obtain a plating layer having a substantially uniform thickness around the through-holes.

The manufacturing method of a semiconductor device according to the present invention, in addition to the above arrangement, may be a method in which:

the plurality of through-holes are provided so as to scattered throughout the semiconductor wafer, at least one of which is provided at least at a substantially center position of the semiconductor wafer; and the conductive layer on the back surface of the semiconductor wafer and the cathode terminals of the electrolytic plating apparatus are electrically connected with each other at least in a vicinity of a center part of the semiconductor wafer.

Still further, according to the above arrangement, the plurality of through-holes are provided so as to be scattered throughout the semiconductor wafer, so that the electrical conductivity with the conductive layer provided on the front surface of the semiconductor wafer can be obtained by the conductive material filled in the through-holes wherever the electrical contact positions are provided between the cathode terminals of the electrolytic plating apparatus and the conductive layer of the back surface of the semiconductor wafer.

Yet further, at least one of the through-holes is provided at least at a substantially center position of the semiconductor wafer, and the conductive layer of the back surface of the semiconductor wafer and the cathode terminals of the electrolytic plating apparatus are electrically connected with each other at least in the vicinity of the center part of the semiconductor wafer. Note that, provision of at least one through-hole at least at a substantially center position of the semiconductor wafer includes the case where a plurality of through-holes are provided on the concentric circle surrounding the center the semiconductor wafer.

Therefore, different from the conventional case of electrical connection with only an outer periphery of the semiconductor wafer, the conductive layers of the front and back surfaces are electrically connected with each other through the conductive material filled in the through-holes which is provided at the substantially center position, even in the vicinity of the center part of the semiconductor wafer where the plating current conventionally has decreased due to the internal resistance of the conductive layer. This makes it possible to obtain a substantially uniform plating current without decrease in the vicinity of the center part of the semiconductor wafer, without increasing the thickness of the conductive layers, which has been conventionally impossible. This makes it possible to obtain the plating layer of a substantially uniform thickness over the semiconductor wafer.

The manufacturing method of a semiconductor device according to the present invention, in addition to the above arrangement, may be a method in which the conductive layer on the back surface of the semiconductor wafer and the cathode terminals of the electrolytic plating apparatus are also electrically connected with each other at plural points of an outer periphery of the semiconductor wafer.

Further, according to the above arrangement, the conductive layer of the back surface of the semiconductor wafer and the cathode terminals of the electrolytic plating apparatus are electrically connected with each other not only in the vicinity of the center part but also at plural points of the outer periphery of the semiconductor wafer. Because of a plurality of through-holes scattered throughout the semiconductor wafer and at least one through-hole positioned at the substantial center of the semiconductor wafer, it is possible to obtain a substantially uniform plating current without decrease in the vicinity of the center part and the outer periphery of the front surface of the conductive layer, without increasing the thickness of the conductive layers. This makes it possible to obtain the plating layer of a substantially uniform thickness in the vicinity of the center part and the outer periphery of the semiconductor wafer.

The manufacturing method of a semiconductor device according to the present invention, in addition to the above arrangement, may be a method (A) in which the step (a) includes the steps of:

(1) providing the through-holes each of which passes between the front and back surfaces of the semiconductor wafer;

(2) providing a protective layer, on the front surface of the semiconductor wafer, for covering the through-holes;

(3) filling the conductive material in the through-holes after the step of (2); and (4) removing the protective layer from the semiconductor wafer, or may be a method (B) in which the steps (b), (a), (c) and (d) are carried out in this order, and the step (a) further includes the steps of:

(1) providing the through-holes each of which passes between the front and back surfaces of the semiconductor wafer;

(2) providing a mask, having mask openings corresponding to parts in which the wires are provided on the conductive layer of the front surface of the semiconductor wafer, so as to cover at least the through-holes;

(3) filling the conductive material in the through-holes, the steps (1), (2), and (3) being carried out in this order.

Further, according to the method of (A), it is possible to easily carry out the step of conducting through-holes for providing the semiconductor wafer including through-holes in which the conductive material is filled.

Still further, according to the method of (B), provision and removal of the protective layer is not required. Therefore, it is possible to more simply and easily carry out the process of fabricating the semiconductor wafer which obtains the electrical conductivity on the front and back surfaces. Further, it is possible to select whether the method (A) or (B) in accordance with the arrangement of the semiconductor device and others.

Note that, in the method (B), the step of conducting through-holes may be a method that is carried out in the order of the step of providing a mask, the step of providing through-holes, the step of filling conductive material.

More specifically, the method (B) may be a method that includes the following steps in the following order:

the step of providing conductive layer for providing a conductive layer over the substantially entire front surface of the semiconductor wafer;

the step of providing a mask for providing a mask having mask openings corresponding to parts where the wires are provided;

the step of providing through-holes for providing through-holes which pass between the front and back surfaces of the semiconductor wafer and of which openings on the front surface of the semiconductor wafer are covered by the mask;

the step of filling conductive material for filling conductive material in the through-holes; and the step of providing conductive layer on a back surface for providing a conductive layer over the substantially entire back surface of the semiconductor wafer.

In addition to the above arrangement (B), the manufacturing method of a semiconductor device according to the present invention may further include the steps of:

(e) peeling off the mask from the semiconductor wafer after providing electrolytic plating;

(f) removing the conductive layer not including the wiring part on the front surface of the semiconductor wafer; and (g) dicing the semiconductor wafer into small pieces so as to provide a plurality of wirings which are electrically independent.

Further, according to the above arrangement, it is possible to easily obtain a semiconductor device as a piece of chip by the step of peeling off a mask, the step of removing a conductive layer, and the step of dicing.

In addition to the above arrangement (A), the manufacturing method of a semiconductor device according to the present invention may further include the steps of:

(1)' forming a mask having mask openings corresponding to parts in which the wires are provided on the conductive layer of the front surface of the semiconductor wafer before the step (d);

(2)' peeling off the mask from the semiconductor wafer after providing electrolytic plating;

(3)' removing the conductive layer not including the wiring part on the front surface of the semiconductor wafer; and (4)' dicing the semiconductor wafer into small pieces so as to provide a plurality of wirings which are electrically independent.

Note that, the step of providing a mask and the step of providing a conductive layer on a back surface may not be carried out in this order and may be carried out in the inverse order.

In addition to the above each arrangement, the manufacturing method of a semiconductor device according to the present invention may be a method in which the conductive material provided in the through-holes is metal.

Further, according to the above arrangement, metal as conductive material provided in the through-holes is better for electrical conductivity, as compared with the case where an electrical conductor by plating is provided in the through-holes and a conductive paste is provided in the through-holes. Still further, a possibility of a short time batch processing of the semiconductor wafer is included, as described later.

In addition to the above each arrangement, the manufacturing method of a semiconductor device according to the present invention may be a method (C) in which the step (3) includes the steps of:

(I) arranging the back surface of the semiconductor wafer and the conductive material so as to contact with each other;

(II) reducing a pressure in an area including the semiconductor wafer and the conductive material from an ambient pressure; and (III) returning the pressure of the area to the ambient pressure so as to fill the conductive material in the through-holes, the steps (I), (II), and (III) being carried out in this order, or may be a method (D) in which the step (3) includes the steps of:

(I) reducing a pressure in an area including the semiconductor wafer and the conductive material from an ambient pressure;

(II) arranging the back surface of the semiconductor wafer and the conductive material so as to contact with each other; and (III) returning the pressure of the area to the ambient pressure so as to fill the conductive material in the through-holes, the steps (I), (II), and (III) being carried out in this order.

Further, according to the method (C), it is possible to carry out batch processing of plural semiconductor wafers, and it is not necessary to provide a complex structure, so that it is possible to process at a low cost.

Still further, according to the method (D), it is possible to carry out batch processing of plural semiconductor wafers, and it is not necessary to provide a complex structure, so that it is possible to process at a low cost. Also, it is possible to select whether the method (C) or (D) in accordance with the arrangement of the semiconductor device and others.

In addition to the above each arrangement, the manufacturing method of a semiconductor device according to the present invention may be a method in which the protective layer is provided so that a protective sheet is pasted over a substantially entire front surface of the semiconductor wafer in the step (2).

Further, according to the above arrangement, the protective layer is provided by pasting a protective sheet, so that it is easy to provide the protective layer.

The manufacturing method of a semiconductor device according to the present invention may be a method in which the mask is a photosensitive resin.

Further, according to the above arrangement, the general photosensitive resin is used as material of the mask, so that the existing steps can be used.

In addition to the above each arrangement, the manufacturing method of a semiconductor device according to the present invention may be a method in which the conductive layer is removed with plasma by dry etching.

Further, according to the above arrangement, the conductive layer is removed with plasma by dry etching, so that the existing steps can be used.

In addition to the above each arrangement, the manufacturing method of a semiconductor device according to the present invention may be a method in which the conductive layer provided on the back surface of the semiconductor wafer is also removed simultaneously.

Further, according to the above arrangement, the conductive layers provided on the front and back surfaces of the semiconductor wafer are removed simultaneously, so that it is possible to simplify the process in case where the removal of the conductive layer of the back surface is necessary.

In addition to the above each arrangement, the manufacturing method of a semiconductor device according to the present invention may be a method in which the conductive layer is removed by chemical etching in which liquid or gas dissolving the conductive layer is used.

Further, according to the above arrangement, chemical etching is carried out for removal of the conductive layer, so that the existing steps can be used. Still further, it is possible to select whether chemical etching or dry etching using plasma as described previously in accordance with the arrangement of the semiconductor device and others.

The invention being thus described, it will be obvious that the same may be varied in many ways. Such variations are not to be regarded as a departure from the spirit and scope of the invention, and all such modifications as would be obvious to one skilled in the art intended to be included within the scope of the following claims.

What is claimed is:

1. A manufacturing method of a semiconductor device for providing wires on a front surface of a semiconductor wafer in such a manner that a conductive layer is provided over a substantially entire front surface of a semiconductor wafer for mounting semiconductor elements, electrolytic plating is carried out to a wiring part on the conductive layer, and then the conductive layer not including the wiring part is partially removed, the manufacturing method comprising the steps of:
(a) providing a plurality of through-holes each of which passes between the front and back surfaces of the semiconductor wafer and then providing conductive material in the through-holes;
(b) providing the conductive layer over the substantially entire front surface of the semiconductor wafer;
(c) providing the conductive layer over a substantially entire back surface of the semiconductor wafer; and
(d) electrically connecting between the conductive layer on the back surface of the semiconductor wafer and cathode terminals of an electrolytic plating apparatus and carrying out electrolytic plating with respect to the wiring part.

2. The manufacturing method of a semiconductor device according to claim 1, wherein substantially uniform plating current is flown inside the conductive layer of the front surface of the semiconductor wafer in the step (d).

3. The manufacturing method of a semiconductor device according to claim 1, wherein the conductive layer provided on the back surface of the semiconductor wafer and the cathode terminals of the electrolytic plating apparatus are electrically connected so that the conductive layers on the front and back surfaces of the semiconductor wafer are substantially electrically connected.

4. The manufacturing method of a semiconductor device according to claim 1, wherein:
the plurality of through-holes are provided so as to scattered throughout the semiconductor wafer, at least one of which is provided at least at a substantially center position of the semiconductor wafer; and
the conductive layer on the back surface of the semiconductor wafer and the cathode terminals of the electrolytic plating apparatus are electrically connected with each other at least in a vicinity of a center part of the semiconductor wafer.

5. The manufacturing method of a semiconductor device according to claim 4, wherein the conductive layer on the back surface of the semiconductor wafer and the cathode terminals of the electrolytic plating apparatus are also electrically connected with each other at plural points of an outer periphery of the semiconductor wafer.

6. The manufacturing method of a semiconductor device according to claim 1, wherein the step (a) includes the steps of:
(1) providing the through-holes each of which passes between the front and back surfaces of the semiconductor wafer;
(2) providing a protective layer, on the front surface of the semiconductor wafer, for covering the through-holes;
(3) filling the conductive material in the through-holes after the step of (2); and
(4) removing the protective layer from the semiconductor wafer.

7. The manufacturing method of a semiconductor device according to claim 6, wherein the step (3) includes the steps of:
(I) arranging the back surface of the semiconductor wafer and the conductive material so as to contact with each other;
(II) reducing a pressure in an area including the semiconductor wafer and the conductive material from an ambient pressure; and
(III) returning the pressure of the area to the ambient pressure so as to fill the conductive material in the through-holes,
the steps (I), (II), and (III) being carried out in this order.

8. The manufacturing method of a semiconductor device according to claim 6, wherein the step (3) includes the steps of:
(I) reducing a pressure in an area including the semiconductor wafer and the conductive material from an ambient pressure;
(II) arranging the back surface of the semiconductor wafer and the conductive material so as to contact with each other; and
(III) returning the pressure of the area to the ambient pressure so as to fill the conductive material in the through-holes,
the steps (I), (II), and (III) being carried out in this order.

9. The manufacturing method of a semiconductor device according to claim 6, wherein the protective layer is provided so that a protective sheet is pasted over a substantially entire front surface of the semiconductor wafer in the step (2).

10. The manufacturing method of a semiconductor device according to claim 1, wherein the steps (b), (a), (c) and (d) are carried out in this order, and the step (a) further includes the steps of:
(1) providing the through-holes each of which passes between the front and back surfaces of the semiconductor wafer;
(2) providing a mask, having mask openings corresponding to parts in which the wires are provided on the conductive layer of the front surface of the semiconductor wafer, so as to cover at least the through-holes;
(3) filling the conductive material in the through-holes,
the steps (1), (2), and (3) being carried out in this order.

11. The manufacturing method of a semiconductor device according to claim 10, wherein the step (3) includes the steps of:
(I) arranging the back surface of the semiconductor wafer and the conductive material so as to contact with each other;
(II) reducing a pressure in an area including the semiconductor wafer and the conductive material from an ambient pressure; and
(III) returning the pressure of the area to the ambient pressure so as to fill the conductive material in the through-holes,
the steps (I), (II), and (III) being carried out in this order.

12. The manufacturing method of a semiconductor device according to claim 10, wherein the step (3) includes the steps of:
(I) reducing a pressure in an area including the semiconductor wafer and the conductive material from an ambient pressure;
(II) arranging the back surface of the semiconductor wafer and the conductive material so as to contact with each other; and
(III) returning the pressure of the area to the ambient pressure so as to fill the conductive material in the through-holes,
the steps (I), (II), and (III) being carried out in this order.

13. The manufacturing method of a semiconductor device according to claim 10, wherein the mask is a photosensitive resin.

14. The manufacturing method of a semiconductor device according to claim 10, further comprising the steps of:
(e) peeling off the mask from the semiconductor wafer after providing electrolytic plating;
(f) removing the conductive layer not including the wiring part on the front surface of the semiconductor wafer; and
(g) dicing the semiconductor wafer into small pieces so as to provide a plurality of wirings which are electrically independent.

15. The manufacturing method of a semiconductor device according to claim 1, further comprising the steps of:
(1) forming a mask having mask openings corresponding to parts in which the wires are provided on the conductive layer of the front surface of the semiconductor wafer before the step (d);
(2) peeling off the mask from the semiconductor wafer after providing electrolytic plating;
(3) removing the conductive layer not including the wiring part on the front surface of the semiconductor wafer; and
(4) dicing the semiconductor wafer into small pieces so as to provide a plurality of wirings which are electrically independent.

16. The manufacturing method of a semiconductor device according to claim 1, wherein the conductive material provided in the through-holes is metal.

17. The manufacturing method of a semiconductor device according to claim 1, wherein the conductive layer is removed with plasma by dry etching.

18. The manufacturing method of a semiconductor device according to claim 1, wherein the conductive layer provided on the back surface of the semiconductor wafer is also removed simultaneously.

19. The manufacturing method of a semiconductor device according to claim 18, wherein the conductive layer is removed by chemical etching in which liquid or gas dissolving the conductive layer is used.

20. The manufacturing method of a semiconductor device according to claim 1, wherein the steps (b), (a), (c) and (d) are carried out in this order, and the step (a) further includes the steps of:

(1) providing a mask, having mask openings corresponding to parts in which the wires are provided on the conductive layer of the front surface of the semiconductor wafer;

(2) providing the through-holes each of which passes between the front and back surfaces of the semiconductor wafer and of which openings on the front surface of the semiconductor wafer are covered by the mask; and (3) filling the conductive material in the through-holes, the steps (1), (2), and (3) being carried out in this order.

21. The manufacturing method of a semiconductor device according to claim 20, wherein the step (3) includes the steps of:

(I) arranging the back surface of the semiconductor wafer and the conductive material so as to contact with each other;

(II) reducing a pressure in an area including the semiconductor wafer and the conductive material from an ambient pressure; and (III) returning the pressure of the area to the ambient pressure so as to fill the conductive material in the through-holes, the steps (I), (II), and (III) being carried out in this order.

22. The manufacturing method of a semiconductor device according to claim 20, wherein the step (3) includes the steps of:

(I) reducing a pressure in an area including the semiconductor wafer and the conductive material from an ambient pressure;

(II) arranging the back surface of the semiconductor wafer and the conductive material so as to contact with each other; and (III) returning the pressure of the area to the ambient pressure so as to fill the conductive material in the through-holes, the steps (I), (II), and (III) being carried out in this order.

23. The manufacturing method of a semiconductor device according to claim 20, wherein the mask is a photosensitive resin.

* * * * *